(12) United States Patent
Kurata et al.

(10) Patent No.: US 7,319,072 B2
(45) Date of Patent: Jan. 15, 2008

(54) POLISHING MEDIUM FOR CHEMICAL-MECHANICAL POLISHING, AND METHOD OF POLISHING SUBSTRATE MEMBER

(75) Inventors: Yasushi Kurata, Ibaraki (JP); Yasuo Kamigata, Ibaraki (JP); Takeshi Uchida, Ibaraki (JP); Hiroki Terasaki, Ibaraki (JP); Akiko Igarashi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 11/352,326

(22) Filed: Feb. 13, 2006

(65) Prior Publication Data

US 2006/0124597 A1 Jun. 15, 2006

Related U.S. Application Data

(62) Division of application No. 10/049,672, filed as application No. PCT/JP00/05508 on Aug. 17, 2000.

(30) Foreign Application Priority Data

Aug. 17, 1999 (JP) ................... 11-230930
Oct. 29, 1999 (JP) ................... 11-308665

(51) Int. Cl.
*H01L 21/461* (2006.01)
*H01L 21/302* (2006.01)

(52) U.S. Cl. ............ 438/690; 438/691; 438/692; 438/693

(58) Field of Classification Search ............. None
See application file for complete search history.

(56) References Cited

U.S. PATENT DOCUMENTS

| 5,340,370 | A | | 8/1994 | Cadien et al. |
| 5,733,176 | A | | 3/1998 | Robinson et al. |
| 5,783,489 | A | * | 7/1998 | Kaufman et al. ........... 438/692 |
| 5,858,513 | A | * | 1/1999 | Jessen ........................ 428/188 |
| 5,876,490 | A | | 3/1999 | Ronay |

(Continued)

FOREIGN PATENT DOCUMENTS

EP 0 649 168 A2 4/1995

(Continued)

OTHER PUBLICATIONS

Japanese Official Action, dated Dec. 13, 2005, issued in corresponding Japanese Patent Application No. 2001-517419 (w/English translation).

(Continued)

*Primary Examiner*—Duy-Vu N Deo
(74) *Attorney, Agent, or Firm*—Antonelli, Terry, Stout & Kraus, LLP.

(57) ABSTRACT

This invention provides a polishing medium for chemical-mechanical polishing, comprising an oxidizing agent for a conductor, a protective-film-forming agent for protecting a metal surface, an acid, and. water; (1) the polishing medium having a pH of 3 or less, and the oxidizing agent being in a concentration of from 0.01 to 3% by weight, or (2) the polishing medium containing abrasive grains having an average particle diameter of 50 nm or less, and the abrasive grains having standard deviation of particle size distribution in a value of more than 5 nm.

11 Claims, 1 Drawing Sheet

U.S. PATENT DOCUMENTS

| | | | |
|---|---|---|---|
| 5,954,997 A | 9/1999 | Kaufman et al. | |
| 6,001,730 A * | 12/1999 | Farkas et al. | 438/627 |
| 6,063,306 A | 5/2000 | Kaufman et al. | |
| 6,171,352 B1 | 1/2001 | Lee et al. | |
| 6,238,592 B1 | 5/2001 | Hardy et al. | |
| 6,326,299 B1 | 12/2001 | Homma et al. | |

FOREIGN PATENT DOCUMENTS

| | | |
|---|---|---|
| EP | 0 846 742 | 6/1998 |
| EP | 0 896 042 A1 | 2/1999 |
| EP | 0 913 442 A2 | 5/1999 |
| EP | 0939431 | 9/1999 |
| EP | 1 125 999 A1 | 8/2001 |
| JP | 10-298538 | 11/1998 |
| JP | 11-021546 | 1/1999 |
| JP | 2001-015463 | 1/2001 |
| WO | WO 98/18159 | 4/1998 |
| WO | WO 98/26025 | 6/1998 |
| WO | WO 99/64527 A1 | 12/1999 |
| WO | WO 01/83638 A1 | 11/2001 |

OTHER PUBLICATIONS

Wang, et al., "Effects of corrosion environments on the surface finishing of copper chemical mechanical polishing", Preparation and Characterization, vol. 308-309, Oct. 31, 1997, pp. 518-522.

Supplementary European Search report dated Feb. 27, 2007, for Application No. 00953466.0—1235 PCT/JP0005508.

* cited by examiner

POLISHING MEDIUM FOR CHEMICAL-MECHANICAL POLISHING, AND METHOD OF POLISHING SUBSTRATE MEMBER

This application is a Divisional Application of prior application Ser. No. 10/049,672, completed Apr. 30, 2002, the contents of which are incorporated herein by reference in their entirety. No. 10/049,672 is a National Stage application, filed under 35 USC 371, of International (PCT) Application No. PCT/JP00/05508, filed Aug. 17, 2000.

TECHNICAL FIELD

This invention, relates to a polishing medium for chemical-mechanical polishing, especially suited for polishing in the step of forming wirings of semiconductor devices, and a method of polishing, a substrate member by the use of the same.

BACKGROUND ART

In recent years, as semiconductor integrated circuits (hereinafter "LSI") are made high-integration and high-performance, new techniques for fine processing have been developed. Chemical-mechanical polishing (hereinafter "CMP") is also one of them, which is a technique often used in LSI fabrication steps, in particular, in making inter laminar insulating films flat in the step of forming multilayer wirings, in forming metallic plugs and in forming buried wirings. This technique is disclosed in, e.g., U.S. Pat. No. 4,944,836.

Recently, in order to make LSIs high-performance, it is also attempted to utilize copper or copper alloys as wiring materials. It, however, is difficult for the copper or copper alloys to be finely processed by dry etching often used in forming conventional aluminum alloy wirings. Accordingly, what is called the damascene method is chiefly employed, in which a copper or copper alloy thin film is deposited on an insulating film with grooves formed previously and is buried therein, and the copper or copper alloy at the part except the grooves is removed by CMP to form buried wirings. This technique is disclosed in, e.g., Japanese Patent Application Laid-open No. 2-278822.

In a common method for the CMP of metals such as copper and copper alloys, a polishing pad is fastened onto a circular polishing platen, and the surface of the polishing pad is soaked with a polishing medium, where a substrate with a metal film formed thereon is pressed against the pad on the former's metal film side and a stated pressure is applied thereto on the back thereof, in the state of which the polishing platen is turned, to remove the metal film at the part of its hills by mechanical friction acting between the polishing medium and the hills of the metal film.

The polishing medium used in such CMP is commonly comprised of an oxidizing agent and abrasive grains, to which a metal-oxide-dissolving agent and a protective-film-forming agent are optionally added. The basic mechanism of CMP making use of this polishing medium for CMP is considered to be that the metal film surface is oxidized with the oxidizing agent and the resultant oxide layer is scraped with the abrasive grains. The oxide layer at the dales of the metal surface does not come into contact with the polishing pad so much and the effect of scraping attributable to the abrasive grains does not extend thereto. Hence, with progress of the CMP, the metal film becomes removed at its hills and the substrate surface become flat. Details on this matter are disclosed in Journal of Electromechanical Society, Vol. 138, No. 11 (published 1991), pages 3460-3464.

In order to make higher the rate of polishing by CMP it is considered effective to add the metal-oxide-dissolving agent. It can be explained that this is because the effect of scraping attributable to the abrasive grains comes higher where grains of metal oxide scraped off by the abrasive grains are made to dissolve (hereinafter "etched") in the polishing medium. However, the addition of the metal-oxide-dissolving agent makes the oxide layer become etched (dissolve) also at the dales of the metal film surface, and the metal film surface becomes uncovered, so that the metal film surface is further oxidized by the oxidizing agent.

With repetition of this, the etching may proceed at the dales of the metal film surface. This may cause a phenomenon that the surface of the metal wiring having been buried after the polishing becomes hollow at the middle thereof like a dish (hereinafter "dishing"), resulting in a damage of the effect of flattening. In order to prevent this phenomenon, the protective-film-forming agent is further added to the metal-polishing medium for CMP. The protective-film-forming agent forms a protective film on the oxide layer at the metal film surface to prevent the oxide layer from dissolving in the polishing medium. It is desirable for this protective film to be readily capable of being scraped off by the abrasive grains arid also not to lower the rate of polishing by CMP.

In order to keep the copper or copper alloy from causing the dishing or from corroding during the polishing, to form highly reliable LSI wirings, a polishing medium for CMP is proposed in which amino acetic acid (glycine) or amidosulfuric acid is used as the metal-oxide-dissolving agent and benzotriazole (hereinafter "BTA") is further used as the protective-film-forming agent. This technique is disclosed in, e.g., Japanese Patent Application Laid-open No. 8-83780.

In the buried-metal formation as in the formation of damascene wirings of copper or copper alloy or the formation of plug wirings of tungsten, a phenomenon called "thinning" in which the thickness of wiring becomes small together with an interlaminar insulating film may occur when an interlaminar insulating film silicon dioxide film formed except the buried part is polished at a rate close to the rate of polishing the metal film. As the result, it may cause an increase in wiring resistance or a non-uniformity in resistance ascribable to pattern density. Hence, the polishing medium for CMP is required to have a property that the polishing rate of the silicon dioxide film is sufficiently smaller than that of the metal film to be polished. Accordingly, a method is proposed in which the pH of the polishing medium is set higher than pKa of −0.5 so that the polishing rate of silicon dioxide can be controlled by negative ions produced as a result of dissociation of acid. This technique is disclosed in, e.g., Japanese Patent No. 2819196.

Meanwhile, at the underlying layer of the copper or copper alloy of the wiring, a layer of tantalum, tantalum alloy, tantalum nitride or other tantalum compound is formed as a barrier layer in order to prevent the copper from diffusing into the interlaminar insulating film. Accordingly, the barrier layer must be removed by CMP, except the wiring part where the copper or copper alloy has been buried. However, the conductor constituting such a barrier layer has a higher hardness than the copper or copper alloy, and hence in many cases any sufficient polishing rate can not be achieved when it is used in combination with the polishing medium for the copper or copper alloy. Accordingly, studies are made on a two-step polishing method having a first step of polishing the copper or copper alloy and a second step of polishing the barrier layer conductor.

In the second-step CMP of the barrier layer, the dishing at the wiring part of buried copper or copper alloy must be prevented, it has been considered reverse-effective to make the polishing medium have a small pH value in order to control the polishing rate and etching rate of the copper or copper alloy.

The tantalum, tantalum alloy and tantalum compound (such as tantalum nitride) used in the barrier layer are chemically so stable that they can be etched with difficulty, and has so high a hardness that they can not readily mechanically be polished as the copper or copper alloy. Hence, making the abrasive grains have a higher hardness may cause polish scratches in the copper or copper alloy to bring about poor electrical characteristics in some cases. Also, making abrasive-grain concentration higher may bring about a higher polishing rate of the silicon dioxide film to cause the problem that the thinning occurs.

DISCLOSURE OF THE INVENTION

An object of the present invention is to provide a polishing medium for CMP which can keep the dishing, thinning and polish scratches from occurring in copper or copper alloy wirings, can materialize high-rate polishing of barrier layers in a low abrasive-grain concentration and can promise formation of highly reliable buried metal film patterns, and a substrate member polishing method making use of the same.

The present inventors made extensive studies in order to achieve this object. As the result, they have discovered that the polishing of the tantalum, tantalum alloy and tantalum compound, which are conductors used as the barrier layers, proceeds with ease when the polishing medium has a low pH and also the oxidizing agent is in a low concentration. Thus, they have accomplished the present invention. The present invention provides a first polishing medium for chemical-mechanical polishing, comprising an oxidizing agent for these conductors, a protective-film-forming agent for protecting a metal surface, an acid, and water; the polishing medium having a pH of 3 or less, and the oxidizing agent being in a concentration of from 0.01 to 3% by weight. This first polishing medium may further contain abrasive grains.

There have been the problems that making the abrasive grains have a higher hardness when the barrier layer is polished may cause polish scratches in the copper alloy to bring about poor electrical characteristics, and making the abrasive grain concentration higher may bring about a higher polishing rate of the silicon dioxide film to cause the problem that the thinning may occur.

The present inventors have discovered that the polishing of the tantalum, tantalum alloy, tantalum nitride and Other tantalum compounds which are used as the barrier layers proceeds with ease in a low pH range and in an oxidizing agent low-concentration range.

Moreover, it has been found that, when such a polishing medium for CMP is used, the oxidizing agent is in a sufficiently low-concentration range, and hence the dishing of wirings does not come into question, which may occur with an increase in the etching rate of the copper or copper alloy and which may commonly come into question in a low-pH range.

The present inventors have also discovered that, in the polishing of the tantalum, tantalum alloy or tantalum compound used as the barrier layer conductor, any too large particle diameter of abrasive grains may bring about a decrease in polishing rate of the barrier layer and an increase in polishing rate of the silicon dioxide, and also that, even when the abrasive grains have a small particle diameter, any too small standard deviation of particle size distribution may bring about an increase in polishing rate of the silicon dioxide. This phenomenon is remarkable when the tantalum, tantalum alloy or tantalum compound is polished with a polishing medium having a low pH and also containing the oxidizing agent in a low concentration.

It has been found that, when such a polishing medium is used, since the oxidizing agent is in a sufficiently low concentration range, the dishing of wirings does not come into question, which may occur with an increase in the etching rate of the copper or copper alloy and which may commonly come into question in a low-pH range, and also any erosion may less occur because of a low abrasive-grain concentration.

Accordingly, in the present invention, a polishing medium may preferably be comprising an oxidizing agent for conductors, a protective-film-forming agent for protecting a metal surface, an acid, and water; a second polishing medium containing abrasive grains, and the abrasive grains having an average particle diameter of 50 nm or less and standard deviation of particle size distribution in a value of more than 5 nm.

The polishing medium of the present invention may preferably have a pH of 3 or less and contain the oxidizing agent in a concentration of from 0.01 to 3% by weight. The polishing medium having a low pH and containing the oxidizing agent in a low concentration can keep the dishing, thinning and polish scratches from occurring in copper or copper alloy wirings, and can materialize high-rate polishing of barrier layers in a low abrasive-grain concentration.

The polishing medium for CMP of the present invention may further contain a water-soluble polymer. In such a case, the oxidizing agent may preferably be in a concentration of from 0.01 to 1.5% by weight. The water-soluble polymer may preferably be at least one selected from the group consisting of polyacrylic acid or a salt thereof, polymethacrylic acid or a salt thereof, polyamic acid or a salt thereof, polyacrylamide, polyvinyl alcohol and polyvinylpyrrolidone.

The acid may preferably be an organic acid, and may more preferably be at least one selected from malonic acid, malic acid, tartaric acid, glycolic acid and citric acid.

The oxidizing agent for conductors may preferably be at least one selected from hydrogen peroxide, nitric acid, potassium periodate, hypochlorous acid and ozone water.

The protective-film-forming agent may preferably be at least one selected from benzotriazole BTA) and a derivative thereof (hereinafter "BTAs").

The abrasive grains may preferably be at least one selected from silica, alumina, ceria, titania, zirconia, germania and silicon carbide. Colloidal silica or colloidal alumina having an average particle diameter of 50 nm or less is preferable for the present invention. The abrasive grains may particularly preferably have an average particle diameter of 30 nm or less, and a standard deviation of particle size distribution of 10 nm or more. The abrasive grains may preferably be in a concentration of from 0.05 to 10% by weight, more preferably from 0.1 to 5% by weight, and particularly preferably from 0.2 to 3% by weight. The colloidal silica may preferably be a product obtained by hydrolysis of a silicon alkoxide. A product obtained using sodium silicate as a materials may also be used.

The polishing medium for CMP of the present invention may preferably have a polishing-rate ratio (Ta/Cu or TaN/Cu) between tantalum or tantalum nitride and copper (inclusive of copper alloys) of more than 1, and a polishing-rate ratio (Ta/SiO$_2$ or TaN/SiO$_2$) between tantalum or tantalum nitride and silicon dioxide film of more than 10.

The conductor (inclusive of semiconductors) suited for the polishing making use of the polishing medium for CMP of the present invention may include copper, copper alloys and copper oxides, and tantalum, tantalum alloys and tantalum compounds (such as tantalum nitride) which constitute barrier layers for the former (layers for preventing copper atoms from diffusing). Accordingly, the present invention provides a polishing method of polishing a barrier layer containing tantalum, a tantalum alloy or a tantalum compound (such as tantalum nitride), by the use of the polishing medium for CMP of the present invention, and also provides a polishing method of polishing a surface including a wiring layer (copper, a copper alloy and/or an oxide thereof) and a barrier layer therefor (a layer for preventing copper atoms from diffusing), by the use of the polishing medium for CMP of the present invention.

BEST MODES FOR PRACTICING THE INVENTION

Figure 1:
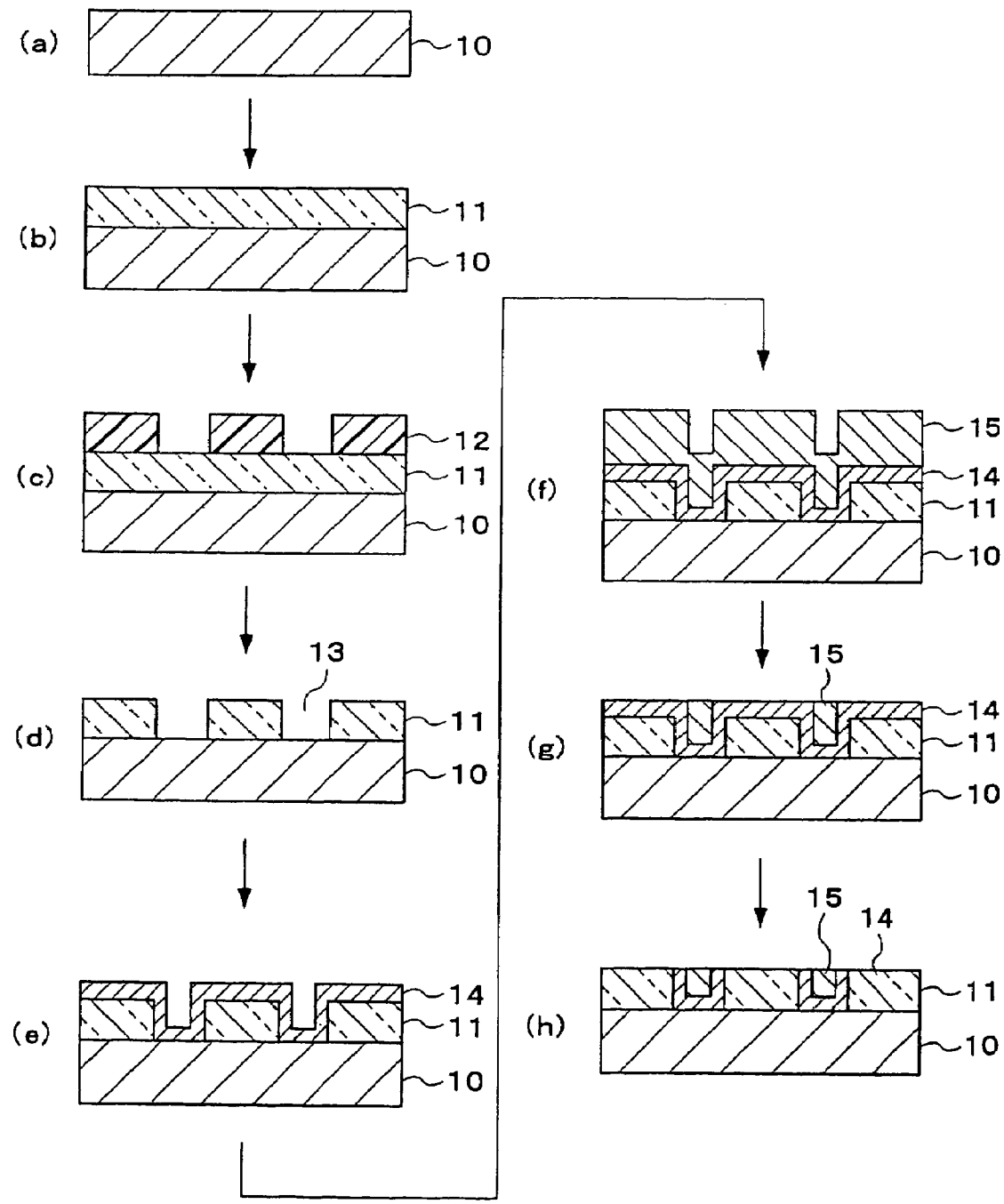
FIG. 1 is an illustration showing the steps of polishing a substrate member in Examples.

The polishing medium of the present invention is suited when a substrate member comprising a substrate which has on its surface a silicon dioxide with a dale and on which a barrier layer and a metal film containing copper or copper alloy have been formed to fill the dale therewith is used as a polishing object. Such a substrate member is obtained by, e.g., as shown in FIG. 1, forming on the surface of a silicon wafer [FIG. 1(a) ] a silicon dioxide film 11 [FIG. 1(b) ], forming on the surface thereof a resist layer 12 having a stated pattern [FIG. 1(c)], forming a dale 13 (valley or concave portion, which can be a hole as seen in FIG. 1(d) in the silicon dioxide film 11 by dry etching and then removing the resist layer 12 [FIG. 1(d)], depositing a barrier metal such as tantalum by vacuum deposition, CVD or the like to form a barrier layer 14 [FIG. 1(e)], and depositing a metal such as copper on the surface thereof by vacuum deposition, plating or CVD to provide a wiring layer 15 [FIG. 1(f)].

This substrate member is subjected to CMP by the use of a polishing medium for copper and copper alloys which has a sufficiently large polishing-rate ratio between the wiring layer (copper and/or copper alloy) and the barrier layer, so that the barrier layer 14 at the hill (the part provided with the silicon dioxide 11) of the substrate member comes uncovered to the surface, thus the desired conductor pattern is obtained in which the wiring layer (copper or copper alloy film) 15 has been left in the dale [FIG. 3. (g)].

This substrate member is further polished with a polishing medium for CMP which can polish away both the barrier layer 14 and the wiring layer 15, so that as shown in FIG. 1(h) a semiconductor substrate member is obtained in which the silicon dioxide 11 stands uncovered to the surface.

The first polishing medium for CMP of the present invention is the polishing medium comprising an oxidizing agent for conductors a protective-film-forming agent for protecting a metal surface, an acid, and water, and has been so regulated that it has a pH of 3 or less and contains the oxidizing agent in a concentration of from 0.01 to 3% by weight. It may further optionally contain water-soluble polymer and abrasive grains.

If the polishing medium for CMP has a high pH of more than 3, a low polishing rate may result on the tantalum, tantalum alloy and/or tantalum compound. The pH may be adjusted by controlling the amount of the acid to be added. It may also be adjusted by adding an alkali component such as ammonia, sodium hydroxide or tetramethylammonium hydride.

The polishing rate of the tantalum, tantalum alloy and/or tantalum compound reaches a maximum when the oxidizing agent for conductors is in a concentration of about 0.15% by weight. The oxidizing agent enables formation of a mechanically readily polishable primary oxide layer on the surface of the conductor film of the tantalum, tantalum alloy or tantalum compound, ensuring a high polishing rate.

In general, when the polishing medium has a pH of less than 3, the etching rate of the copper or copper alloy film is so high as to make it difficult for the protective-film-forming agent to control the etching. However, in the present invention, the oxidizing agent is in so sufficiently a low concentration that the protective-film-forming agent can make etching control. If the oxidizing agent is in a high concentration of more than 3% by weight, not only the etching rate of the copper or copper alloy may be so high as to tend to cause the dishing, but also a secondary oxide layer which can be polished with greater difficulty than the primary oxide layer may be formed on the surface of the conductor film of the tantalum, tantalum alloy or tantalum nitride or other tantalum compound, resulting in a low polishing rate. If the oxidizing agent is in a concentration of less than 0.01% by weight, the oxide layer can not sufficiently be formed, resulting in a low polishing rate to even cause peeling of the tantalum film in some cases.

The polishing medium for CMP of the present invention may further contain abrasive grains. To achieve a high dispersion stability and make any polishing scratches less occur, the abrasive grains may preferably have an average particle diameter of 100 nm or less, and particularly preferably 50 nm or less.

A second polishing medium for CMP of the present invention is the polishing medium comprising an oxidizing agent for conductors, a protective-film-forming agent for protecting a metal surface, an acid, and water; the polishing medium further containing abrasive grains, and the abrasive grains having an average particle diameter of 50 nm or less and a standard deviation of particle size distribution, of more than 5 nm. This second polishing medium, too, may preferably be so regulated that it has a pH of 3 or less and contains the oxidizing agent for conductors in a concentration of from 0.01 to 3% by weight. If necessary, a water-soluble polymer maybe added. Abrasive grains having an average particle diameter of 30 nm or less and having a standard deviation of particle size distribution of more than 10 nm are particularly preferred in the present invention. If they have a large average particle diameter of more than 50 nm, a low polishing rate may result on the barrier layer, and a high polishing rate on the silicon dioxide film. Also, even when they have an average particle diameter of 50 nm or less, a high polishing rate tends to result on the silicon dioxide flint if their standard deviation of particle size distribution is 50 nm or less.

The oxidizing agent in the first or second polishing medium for CMP of the present invention may preferably be used in a concentration of from 0.01 to 1.5% by weight when the water-soluble polymer is contained. The water-soluble polymer comes adsorbed to the surface of the tantalum, tantalum alloy or tantalum compound or its oxide layer, and hence the oxidizing agent which contributes to the high polishing rate can be in a low concentration range. Also, the water-soluble polymer tends to come adsorbed especially to the surface of the nitride compound film such as tantalum nitride film or titanium nitride film, and hence it is considered that the polishing rate of the nitride compound film such as tantalum nitride film or titanium nitride film can be low. Meanwhile, the water-soluble polymer has the effect of forming a metal surface protective film to improve flat-surface retentivity against the dishing and thinning.

The oxidizing agent for conductors in the present invention may include hydrogen peroxide ($H_2O_2$), nitric acid, potassium periodate, hypochlorous acid and ozone water. Of these, hydrogen peroxide is particularly preferred. Where the substrate member is a silicon substrate member including devices for integrated circuits, it is undesirable for it to be contaminated with alkali metals, alkaline earth metals, halides and so forth. Hence, an oxidizing agent not containing any in-volatile component is preferred. Here, since the ozone water may undergo a great compositional change with time, the hydrogen peroxide is most suited. However, where the substrate member to be polished is a glass substrate member not including any semiconductor devices, an oxidizing agent containing a in-volatile component may be used without any problem.

The acid used in the present invention may preferably be formic acid or an organic acid (such as acetic acid, propionic acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoiC acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid or citric acid). Also usable are salts such as ammonium salts of these, sulfuric acid, nitric acid, ammonia, ammonium salts as exemplified by ammonium persulfate, ammonium nitrate and ammonium chloride, and chromic acid, or mixtures of these. Of these, in view of an advantage that practical CMP polishing rate can be achieved, malonic acid, malic acid, tartaric acid, glycolic acid and citric acid are preferred.

The protective-film-forming agent in the present invention is selected from benzotriazole (BTA) and BTA derivatives (e.g., tolyltriazole, which is a compound in which one hydrogen atom of the benzene ring has been 10 substituted with a methyl group;

benzotriazole 4-carboxylic acid, which is a compound in which the same has been substituted with a carboxyl group; and methyl, ethyl, propyl, butyl and octyl esters thereof), naphthotriazole, and naphthotriazole derivatives, or mixtures containing any of these.

The water-soluble polymer used in the present invention may include polymers having as a basic building block a monomer having a carboxyl group, or salts thereof, as exemplified by polyacrylic acid, ammonium polyacrylate, sodium polycrylate, polymethacrylic acid, ammonium polymethacrylate, sodium polymethacrylate and polyacrylamide and polymers having as a basic building block a monomer having a vinyl group, as exemplified by polyvinyl alcohol and polyvinylpyrrolidone. Where, however, the substrate member to be polished is a silicon substrate member for semiconductor integrated circuits, it is undesirable for it to be contaminated with alkali metals, alkaline earth metals, halides and so forth. Hence, acids or ammonium salts thereof are preferred. Where the substrate member is a glass substrate member, the same does not necessarily apply. The addition of any of these water-soluble polymers enables improvement of dishing-preventive performance on account of the etching control effect attributable to the protective-film-forming agent.

The present invention also provides a polishing medium for CMP, having a polishing-rate ratio (Ta/Cu or TaN/CU) between tantalum or tantalum nitride and copper inclusive of copper alloys) of more than 1, and a polishing-rate ratio between tantalum or tantalum nitride and silicon dioxide (Ta/$SiO_2$ or TaN/$SiO_2$) of more than 10.

As described above, where in the present invention the polishing medium for CMP has a low pH of less than 3 and a low oxidizing-agent concentration (the oxidizing agent is in a concentration of about 0.15% by weight), the polishing rate of the tantalum, tantalum alloy or tantalum nitride or other tantalum compound used as the barrier layer can reach a maximum. Where its pH is less than 3, the etching rate of the copper or copper alloy comes higher, but, because of the sufficiently low concentration of the oxidizing agent, can be controlled by the protective-film-forming agent. Also, where the abrasive grains of colloidal silica or colloidal alumina having an average particle diameter of 50 nm or less is used, which lowers the polishing rate of silicon dioxide, the polishing-rate ratio (Ta/Cu or TaN/Cu) between tantalum or tantalum nitride and copper (inclusive of copper alloys) can be made more than 1 and also the polishing-rate ratio (Ta/$SiO_2$ or TaN/$SiO_2$) between tantalum or tantalum nitride and silicon dioxide can be made more than 10.

The abrasive grains usable in the polishing medium for CMP may be any of inorganic abrasive grains such as silica, alumina, ceria, titania, zirconia, germania and silicon carbide, and organic abrasive grains such as polystyrene, polyacrylic or polyvinyl chloride particles. Colloidal silica or colloidal alumina having an average particle diameter of 50 nm or less are preferred, as having a good dispersibility in the polishing medium and being less causative of polish mars (scratches) which maybe caused by CMP. As their average particle diameter, those having an average particle diameter of 30 nm or less are preferred by which the polishing rate of the barrier layer can be made higher and the polishing rate of silicon dioxide film can be made lower, and those of 20 nm or less are particularly preferred. As the colloidal silica, a product obtained by hydrolysis of a silicon alkoxide or by ion exchange of sodium silicate may be used, for example. As the colloidal alumina, a product obtained by hydrolysis of aluminum nitrate may be used, for example.

The abrasive grains in the first or second polishing medium for CMP may preferably be added in an amount ranging from 0.01% by weight to 10% by weight, and more preferably from 0.05% by weight to 5% by weight, based on the total weight. If it is added in an amount of less than 0.01% by weight, there may be no significant difference from the polishing rate of a case not containing any abrasive grains. If it is more than 10% by weight, its addition in a larger quantity than that may no longer bring about any improvement of the rate of polishing by CMP.

The polishing medium for CMP of the present invention is especially suited for the polishing of conductors (inclusive of semiconductors) such as copper, copper alloys and copper oxides, and barrier layers for these (e.g., tantalum, tantalum alloys and tantalum compounds such as tantalum nitride.

The acid in the polishing medium of the present invention may be mixed in an amount of from 0.0001 to 0.05 mol, and more preferably from 0.001 to 0.01 mol, based on the total weight 100 g of the oxidizing agent for conductors, acid, protective-film-forming agent, water-soluble polymer and water. If it is mixed in an amount of more than 0.05 mol, the etching of the copper or copper alloy tends to proceed too much.

The protective-film-forming agent in the polishing medium of the present invention may be mixed in an amount of from 0.0001 to 0.01 mol, and more preferably from 0.0005 to 0.005 mol, based on the total weight 100 g of the oxidizing agent for conductors, acid, protective-film-forming agent, water-soluble polymer and water. If it is mixed in an amount of less than 0.0001 mol, the etching of the copper or copper alloy tends to proceed too much. If it is in an amount of more than 0.01 mol, there can be no change in the effect.

In the present invention, the water-soluble polymer may also be added, and the water-soluble polymer may be mixed in an amount of from 0.001 to 0.5% by weight, and more preferably from 0.01 to 0.2% by weight, based on the total weight 100 g of the oxidizing agent for conductors, acid, protective-film-forming agent, water-soluble polymer and water. If it is mixed in an amount of less than 0.001% by weight, the effect attributable to its use in combination with the protective-film-forming agent tends not to be brought out in etching control. If it is in an amount of more than 0.5% by weight, a low rate of polishing by CMP tends to result.

The method of polishing the substrate by the use of the polishing medium for CMP of the present invention is a polishing method in which the polishing medium for CMP is fed to a polishing pad on a polishing platen, and, bringing it into contact with a surface to be polished, the surface to be polished and the polishing pad are relatively moved to polish the surface. As an apparatus for such polishing, a commonly available polishing apparatus may be used which has a holder for holding a semiconductor substrate member having the surface to be polished and a polishing platen to which the polishing pad has been fastened (fitted with, e.g., a motor whose number of revolutions is variable). As the polishing pad, commonly available nonwoven fabric, foamed polyurethane, porous fluorine resin and so forth may be used without any particular limitations. There are no particular limitations on polishing conditions. It is preferable to rotate the polishing platen at a low rotation of 200 rpm or less so that the substrate does not rush out therefrom. The semiconductor substrate member having the surface to be polished (the film to be polished) may preferably be pressed against the polishing pad at a pressure of from 9.8 to 98.1 kPa (from 100 to 1,000 gf/cm$^2$), and more preferably from 9.8 to 49.0 kPa (from 100 to 500 gf/cm$^2$) in order to satisfy the wafer in-plane uniformity of polishing rate and the flatness of patterns. In the course of the polishing, the polishing medium for CMP is continuously fed to the polishing pad. There are no particular limitations on this feed quantity. It is preferable for the polishing-pad surface to be always covered with the polishing medium. The semiconductor substrate member on which the polishing has been completed may preferably be washed thoroughly in running water and thereafter be set on a spin dryer to blow off any drops of water adhering onto the semiconductor substrate member, followed by drying.

EXAMPLES

The present invention is specifically described below by giving Examples. The present invention is by no means limited by these Examples.

(1) Preparation of Polishing Medium for Chemical-Mechanical Polishing:

As shown in Table 1, to a mixture of 0.4% by weight of an acid, abrasive grains (but not added in Example 1; 1 part by weight in Examples 2 to 7 and Comparative Examples 1 and 2; and 1% by weight in Examples 8 to 11, 0.05 part by weight of a water-soluble polymer (but only in Examples 4, 6 and 7) and 0.2% by weight of a protective-film-forming agent (BTA), water (98/85 parts by weight in Examples 1 to 7 and Comparative Examples 1 and 2, and 97.9% by weight in Examples 8 to 11) was added to effect dissolution, followed by addition of hydrogen peroxide water (a guaranteed reagent, an aqueous 30% solution) as an oxidizing agent for conductors to obtain polishing mediums for CMP. Here, as the abrasive grains, colloidal silica with an average particle diameter of 20 to 60 nm was added which was prepared by hydrolysis in an ammonia solution of tetraethoxysilane. Also, the malic acid and glycolic acid used each had a pKa of 3.2.

TABLE 1

| | | | | Abrasive grains (colloidal silica) | | |
| | | | | Av. | Standard deviation of | |
| | | Hydrogenperoxide concentration | | Particle diameter | particle size | Water-soluble |
| Example | Acid | (wt. %) | pH | (nm) | distribution | polymer |
| --- | --- | --- | --- | --- | --- | --- |
| 1 | glycolic acid | 0.15 | 2.58 | — | — | none |
| 2 | malic acid | 0.15 | 2.50 | 20 | 10 | none |
| 3 | malic acid | 1.5 | 2.49 | 20 | 10 | none |
| 4 | malic acid | 0.15 | 2.80 | 20 | 10 | ammonium polyacrylate |
| 5 | glycolic acid | 0.15 | 2.58 | 20 | 10 | none |
| 6 | glycolic acid | 0.15 | 2.95 | 20 | 10 | ammonium polyacrylate |
| 7 | malic acid | 1.8 | 2.76 | 20 | 10 | ammonium polyacrylate |
| 8 | malic acid | 3.3 | 2.45 | 20 | 10 | none |
| 9 | malic acid | 0.15 | 3.25 | 20 | 10 | none |
| 10 | malic acid | 0.15 | 2.50 | 25 | 10 | none |
| 11 | malic acid | 0.15 | 2.50 | 40 | 14 | none |
| 12 | malic acid | 0.15 | 2.52 | 60 | 13 | none |
| 13 | malic acid | 0.15 | 2.51 | 30 | 5 | none |

(2) Polishing:
Using the polishing mediums for CMP thus obtained, CMP was carried out. Polishing conditions are as follows:
Substrate Member:
Silicon substrate with a tantalum film formed thereon in a thickness of 200 nm.
Silicon substrate with a tantalum nitride film formed thereon in a thickness of 100 nm.
Silicon substrate with a silicon dioxide film formed thereon in a thickness of 1 µm.
Silicon substrate with a copper film, formed thereon in a thickness of 1 µm.
Polishing Pad:
Foamed polyurethane resin with closed cells.
Polishing pressure: 25 kPa (250 gf/cm$^2$).
Relative speed of substrate member to polishing platen: 18 m/minute.
(3) Polished-Product Evaluation Items:
On the polished products having been processed by CMP, evaluation was made on the following items. Rate of polishing by CMP:
Determined by calculation from electrical resistance value in respect of the difference in layer thickness before and after the film was polished by CMP Etching rate:
Determined by calculation from electrical resistance value in respect of the difference in copper layer thickness before and after immersion in the polishing medium for chemical-mechanical polishing, having been stirred at 25° C. and 100 rpm.
Dishing Level:
A silicon substrate having thereon a silicon dioxide film in which grooves of 0.5 µm in depth were formed, a tantalum nitride film formed thereon by known sputtering in a thickness of 50 nm as the barrier layer and a copper film similarly formed thereon by sputtering and buried in the groove by known heat treatment was used as a substrate member, and was subjected to two-step polishing. Then, from the surface profile of a pattern area in which stripes of 100 µm in width for the part of wiring metal and 100 µm in width for the part of insulating film were arranged alternately, the level of film loss at the part of wiring metal with respect to the part of insulating film was determined by means of a stylus surface profilometer. As the first-stage polishing medium for copper, a polishing medium for copper and copper alloys, having a sufficiently large polishing-rate ratio of the copper to the tantalum nitride, was used to carry out the polishing. After the first-stage polishing, a substrate member sample was so prepared that the dishing level measured in the state the barrier layer stood uncovered onto the part of insulating film came to 50 nm, and was then subjected to the second-stage polishing using the above polishing medium for chemical-mechanical polishing, until the barrier layer came lost at the part of insulating film.

Thinning Level:
The surface profile of a pattern area in which stripes of 2.5 mm in total width, consisting of 45 µm in width for the part of wiring metal and 5 µm in width for the part of insulating film which were arranged alternately, formed in the substrate member used to evaluate the above dishing level, was measured with the stylus surface profilometer to determine the level of film loss at the part of insulating film in the vicinity of the middle of the pattern with respect to the part of the insulating film field around the stripe pattern. After the first-stage polishing, a substrate member sample was so prepared that the thinning level measured in the state the barrier layer stood uncovered onto the part of insulating film came to 20 nm, and was then subjected to the second-stage polishing using the above polishing medium for chemical-mechanical polishing, until the barrier layer came lost at the part of insulating film.
(4) Evaluation Results:
The rate of polishing by CMP in each Example is shown in Table 2. Also, the dishing level and the thinning level are shown in Table 3.

TABLE 2

| | CMP polishing rate (nm/minute) | | | | Copper etching rate (nm/minute) |
|---|---|---|---|---|---|
| | Copper | Tantalum | Tantalum nitride | Silicon dioxide | |
| Example | | | | | |
| 1 | | 4.0 | 5.0 | 0 | 0.5 |
| 2 | | 36.2 | 54.7 | 0.8 | 0.8 |
| 3 | | 24.9 | 44.9 | 1.3 | 3.2 |
| 4 | | 34.9 | 24.9 | 1.2 | 0.3 |
| 5 | | 33.0 | 61.5 | 1.3 | 0.7 |
| 6 | | 20.0 | 25.0 | 1.3 | 0.6 |
| 7 | | 1.1 | 5.5 | 1.7 | 0.4 |
| Comparative Example | | | | | |
| 1 | | 10.5 | 17.3 | 1.2 | 6.7 |
| 2 | | 2.0 | 3.0 | 0.7 | 0.1 |
| 10 | 11.4 | 36.2 | 54.7 | 0.8 | |
| 11 | 3.2 | 28.8 | 43.2 | 0.8 | |
| 12 | 13.0 | 22.0 | 43.4 | 6.7 | |
| 13 | 23.4 | 30.4 | 57.7 | 9.5 | |

TABLE 3

| | Example 12 | | | | | | | | | | | | |
|---|---|---|---|---|---|---|---|---|---|---|---|---|---|
| Dishing level (nm) | 40 | 55 | 70 | 45 | 55 | 45 | 65 | 100 | 55 | 40 | 40 | 60 | 55 |
| Thinning level (nm) | 20 | 30 | 35 | 30 | 35 | 30 | 70 | 55 | 70 | 20 | 20 | 60 | 100 |

In Examples 1 to 11, good dishing- and thinning-preventive performance has been achieved. In particular, in Examples 1 to 6, in which the oxidizing agent is in a concentration of from 0.01 to 3% by weight and the pH is 3 or less, the polishing rates of tantalum and tantalum nitride are so high and the dishing level and thinning level are so small as to be especially preferable. Also, in Examples 8 and 9, the polishing rate of tantalum nitride film is high and the polishing rate of silicon dioxide film is relatively low, and hence good dishing- and thinning-preventive performance is achieved.

In particular, in Examples 4 and 6, in which the water-soluble polymer is used arid the oxidizing agent is in a concentration ranging from 0.01 to 1.5% by weight, the dishing and the thinning occur in a smaller level, showing better results, than Example 7, in which the oxidizing agent is added in a larger quantity (1.8% by weight). Here, when the water-soluble polymer is used, it is preferable for the water-soluble polymer to be added in a concentration of from 0.01 to 1.5% by weight. If it is added in an amount larger than that, a low polishing rate tends to result on the tantalum or tantalum nitride and the thinning may occur in a large level.

Example 2, in which the oxidizing agent is in a concentration of 3% by weight or less and the pH is 3 or less, is also preferable because the etching rate of copper is lower than that in Comparative Example 1, in which the oxidizing agent is in a concentration of more than 3% by weight, and also the polishing rate of tantalum or tantalum nitride is higher and the level of dishing and thinning is smaller than those in Comparative Example 2, in which the pH is more than 3.

In Examples 8 to 9, the polishing rate of the barrier layer film (in particular, the tantalum film) is higher and the polishing rate of the silicon dioxide film is lower than those in Example 10, in which the abrasive grains have a large particle diameter. Thus, these Examples are superior in view of the dishing- and thinning-preventive performance. Also, in Examples 8 to 9, the polishing rate of the barrier layer film (in particular, the tantalum film) is at the same rank as, but the polishing rate of the silicon dioxide film is lower than, those in Example 11, in which the standard deviation of particle size distribution is smaller.

POSSIBILITY OF INDUSTRIAL APPLICATION

As described above, according to the present invention, the tantalum, tantalum alloy or tantalum compound or the like used as the barrier layer can efficiently be polished, and also the dishing, thinning and polish scratches can be kept from occurring in copper or copper alloy wirings to form highly reliable buried metal film patterns.

What is claimed is:

1. A method of polishing a substrate member, comprising a step of polishing a barrier layer containing tantalum, a tantalum alloy or a tantalum compound by the use of a polishing medium for chemical-mechanical polishing, said polishing medium including:
   an oxidizing agent;
   a protective-film-forming agent;
   an acid; and
   water, wherein:
   said polishing medium does not include abrasive grains,
   said polishing medium has a pH of 3 or less, and
   said oxidizing agent is in a concentration of from 0.01% by weight to 3% by weight, and wherein:
   the polishing medium for chemical-mechanical polishing has, under polishing conditions of a polishing pressure of 25 kPa and relative speed of substrate member to polishing platen of 18 m/minute:
   a polishing-rate ratio (Ta/Cu) between tantalum and copper or a copper alloy of more than 1;
   a polishing-rate ratio (TaN/Cu) between tantalum nitride and copper or a copper alloy of more than 1;
   a polishing-rate ratio ($Ta/SiO_2$) between tantalum and silicon dioxide of more than 10; and
   a polishing-rate ratio ($TaN/SiO_2$) between tantalum nitride and silicon dioxide of more than 10; and
   the polishing is performed in the absence of abrasive.

2. The method according to claim 1, wherein said medium has a pH of 2.49 to 2.95.

3. The method according to claim 1, wherein said oxidizing agent has a concentration of 0.15 to 1.5% by weight.

4. A method of polishing a substrate member having a barrier layer containing at least one of tantalum, a tantalum alloy and a tantalum compound overlying an insulator and a conductor layer containing at least one of copper, a copper alloy and copper oxide on the barrier layer, comprising:
   chemical-mechanical polishing the conductor layer, using a first chemical-mechanical polishing medium, so as to remove portions of the conductor layer and expose portions of the barrier layer, in a first step; and
   thereafter, chemical-mechanical polishing exposed portions of the barrier layer, in the absence of abrasive, using a second chemical-mechanical polishing medium, wherein the second chemical-mechanical polishing medium comprises:
   an oxidizing agent;
   a protective-film-forming agent;
   an acid; and
   water, wherein:
   said polishing medium has a pH of 3 or less, and
   said oxidizing agent is in a concentration of from 0.01% by weight to 3% by weight.

5. The method according to claim 4, wherein said medium has a pH of 2.49 to 2.95.

6. The method according to claim 4, wherein said oxidizing agent has a concentration of 0.15 to 1.8% by weight.

7. The method according to claim 4, wherein said oxidizing agent has a concentration of 0.15 to 1.5% by weight.

8. The method according to claim 4, wherein said first polishing medium is different from said second polishing medium, and polishes the at least one of copper, copper alloy and copper oxide at a higher polishing rate than the polishing rate by the first polishing medium of said at least one of tantalum, tantalum alloy and tantalum compound.

9. The method according to claim 4, wherein said insulator includes concave portions, and the barrier layer is provided in said concave portions and said conductor layer fills said concave portions.

10. The method according to claim 9, wherein said concave portions are holes extending through the insulator.

11. A method of polishing a substrate member comprising a step of polishing a surface including a wiring layer and a barrier layer, by applying to the surface a polishing medium for chemical-mechanical polishing, adapted to polish a barrier layer of tantalum, a tantalum alloy or a tantalum compound, which is a barrier layer for a wiring layer of copper, copper alloy, or copper oxide, said polishing medium comprising:
   an oxidizing agent;
   a protective-film-forming agent;
   an acid; and
   water, wherein:
   said polishing medium does not include abrasive grains,
   said polishing is performed in the absence of abrasives.
   said polishing medium has a pH of 3 or less, and
   said oxidizing agent is in a concentration of from 0.01% by weight to 3% by weight, and wherein:
   as a polishing condition, polishing pressure is 25 kPa and relative speed of substrate member to polishing platen is 18 m/minute, the polishing medium for chemical-mechanical polishing has:
   a polishing-rate ratio (Ta/Cu) between tantalum and copper or a copper alloy of more than 1;
   a polishing-rate ratio (TaN/Cu) between tantalum nitride and copper or a copper alloy of more than 1;
   a polishing-rate ratio ($Ta/SiO_2$) between tantalum and silicon dioxide of more than 10; and
   a polishing-rate ratio ($TaN/SiO_2$) between tantalum nitride and silicon dioxide film of more than 10.

* * * * *